US012295133B2

(12) United States Patent
Xie et al.

(10) Patent No.: US 12,295,133 B2
(45) Date of Patent: May 6, 2025

(54) SRAM WITH BACKSIDE CROSS-COUPLE

(71) Applicant: INTERNATIONAL BUSINESS MACHINES CORPORATION, Armonk, NY (US)

(72) Inventors: Ruilong Xie, Niskayuna, NY (US); Albert M Chu, Nashua, NH (US); Carl Radens, LaGrangeville, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 17/660,431

(22) Filed: Apr. 25, 2022

(65) Prior Publication Data

US 2023/0345691 A1    Oct. 26, 2023

(51) Int. Cl.
*H10B 10/00* (2023.01)
*H10D 30/67* (2025.01)

(52) U.S. Cl.
CPC ....... *H10B 10/125* (2023.02); *H10D 30/6729* (2025.01); *H10B 10/00* (2023.02)

(58) Field of Classification Search
CPC ......... H01L 29/41733; H01L 29/42392; H01L 29/78696; H10B 10/125; H10D 30/6729; H10D 30/6735; H10D 30/6757
See application file for complete search history.

(56) References Cited

U.S. PATENT DOCUMENTS

| | | | |
|---|---|---|---|
| 8,216,902 B2 | 7/2012 | Chang | |
| 10,083,971 B1 * | 9/2018 | Zang | H01L 29/66666 |
| 10,090,193 B1 * | 10/2018 | Chanemougame | H01L 23/485 |
| 10,192,819 B1 | 1/2019 | Chanemougame | |
| 10,192,867 B1 | 1/2019 | Frougier | |
| 10,424,580 B2 | 9/2019 | Cappellani | |
| 10,510,622 B1 | 12/2019 | Frougier | |
| 10,651,284 B2 * | 5/2020 | Xie | H10D 84/85 |
| 10,707,218 B2 | 7/2020 | Paul | |
| 10,840,146 B1 * | 11/2020 | Paul | H01L 29/78696 |
| 11,139,213 B2 | 10/2021 | Gardner | |
| 11,195,797 B2 | 12/2021 | Vadi | |
| 11,195,911 B2 * | 12/2021 | Xie | H10D 84/013 |

(Continued)

OTHER PUBLICATIONS

Chang et al., "First Demonstration of CMOS Inverter and 6T-SRAM Based on GAA CFETs Structure for 3D-IC Applications," International Electron Devices Meeting (IEDM), 2019, © 2019 IEEE, pp. 11.7.1-11.7.4.

(Continued)

*Primary Examiner* — Ida M Soward
(74) *Attorney, Agent, or Firm* — Yuanmin Cai

(57) ABSTRACT

Embodiments of present invention provide a SRAM memory. The SRAM memory includes a frontside and a backside; a first pull-up (PU) transistor stacked over a first pull-down (PD) transistor; a second PU transistor stacked over a second PD transistor; a frontside cross-couple at the frontside, above the first and second PU transistors, that connects a first source/drain (S/D) region of the first PU transistor with a gate of the second PU transistor; and a backside cross-couple, at the backside underneath the first and second PD transistors, that connects a first S/D region of the second PD transistor with a gate of the first PD transistor. A method of manufacturing the SRAM memory is also provided.

20 Claims, 11 Drawing Sheets

(56) References Cited

U.S. PATENT DOCUMENTS

| | | | |
|---|---|---|---|
| 11,349,004 B2* | 5/2022 | Yu | H10D 84/038 |
| 11,888,044 B2* | 1/2024 | Park | H01L 29/78618 |
| 2021/0202500 A1* | 7/2021 | Chanemougame | H01L 29/0673 |
| 2021/0351079 A1 | 11/2021 | Su | |
| 2021/0357565 A1 | 11/2021 | Fang | |
| 2022/0102362 A1* | 3/2022 | Chanemougame | H01L 27/0688 |
| 2022/0271122 A1* | 8/2022 | Chuang | H01L 29/1606 |
| 2022/0415906 A1* | 12/2022 | Park, II | H01L 29/78618 |
| 2023/0052477 A1* | 2/2023 | Ha | H01L 29/0673 |

OTHER PUBLICATIONS

Ryckaert et al., "The Complementary FET (CFET) for CMOS scaling beyond N3", 2018 Symposium on VLSI Technology Digest of Technical Papers, pp. 141-142.

\* cited by examiner

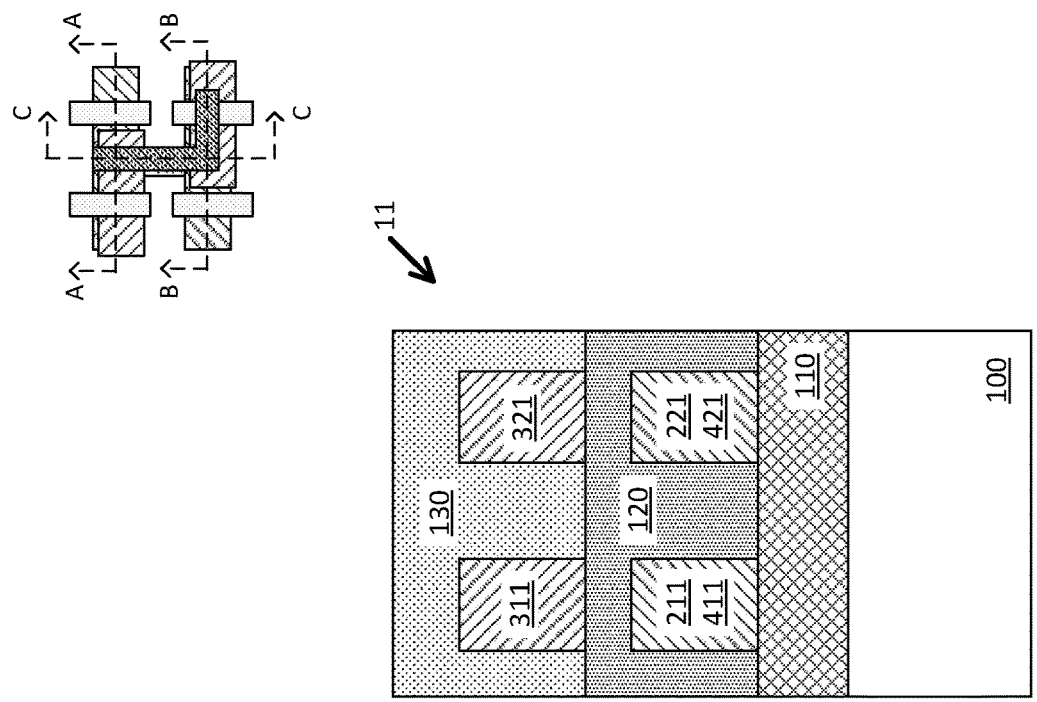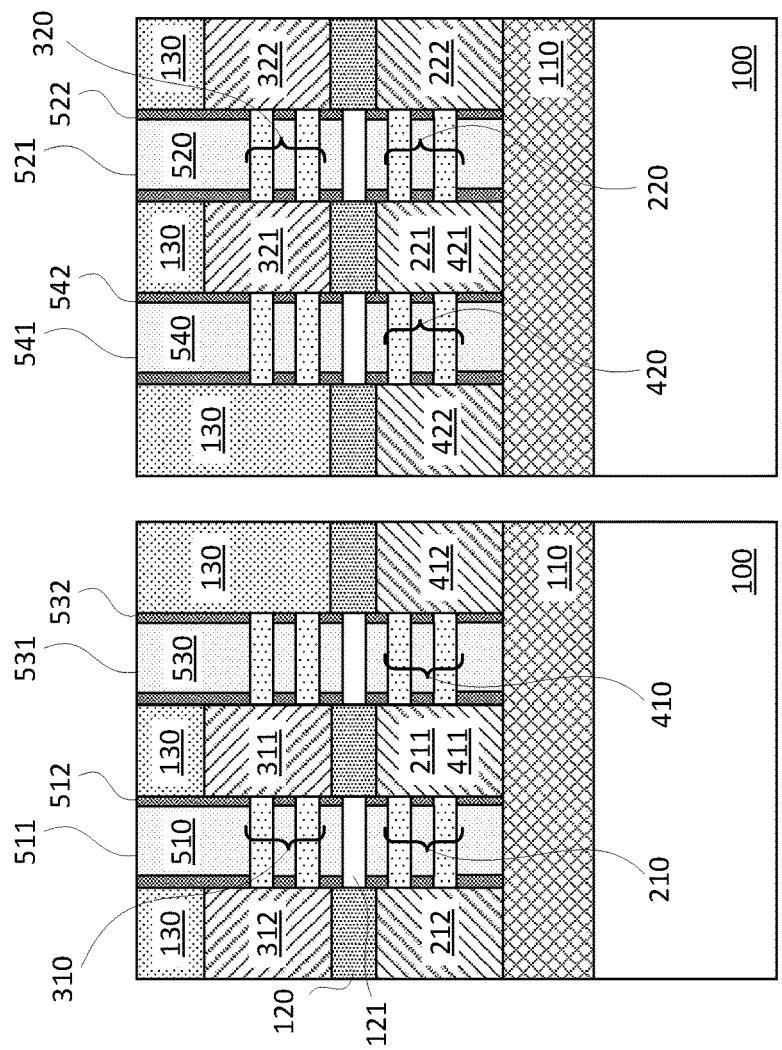
FIG. 1C
FIG. 1B
FIG. 1A

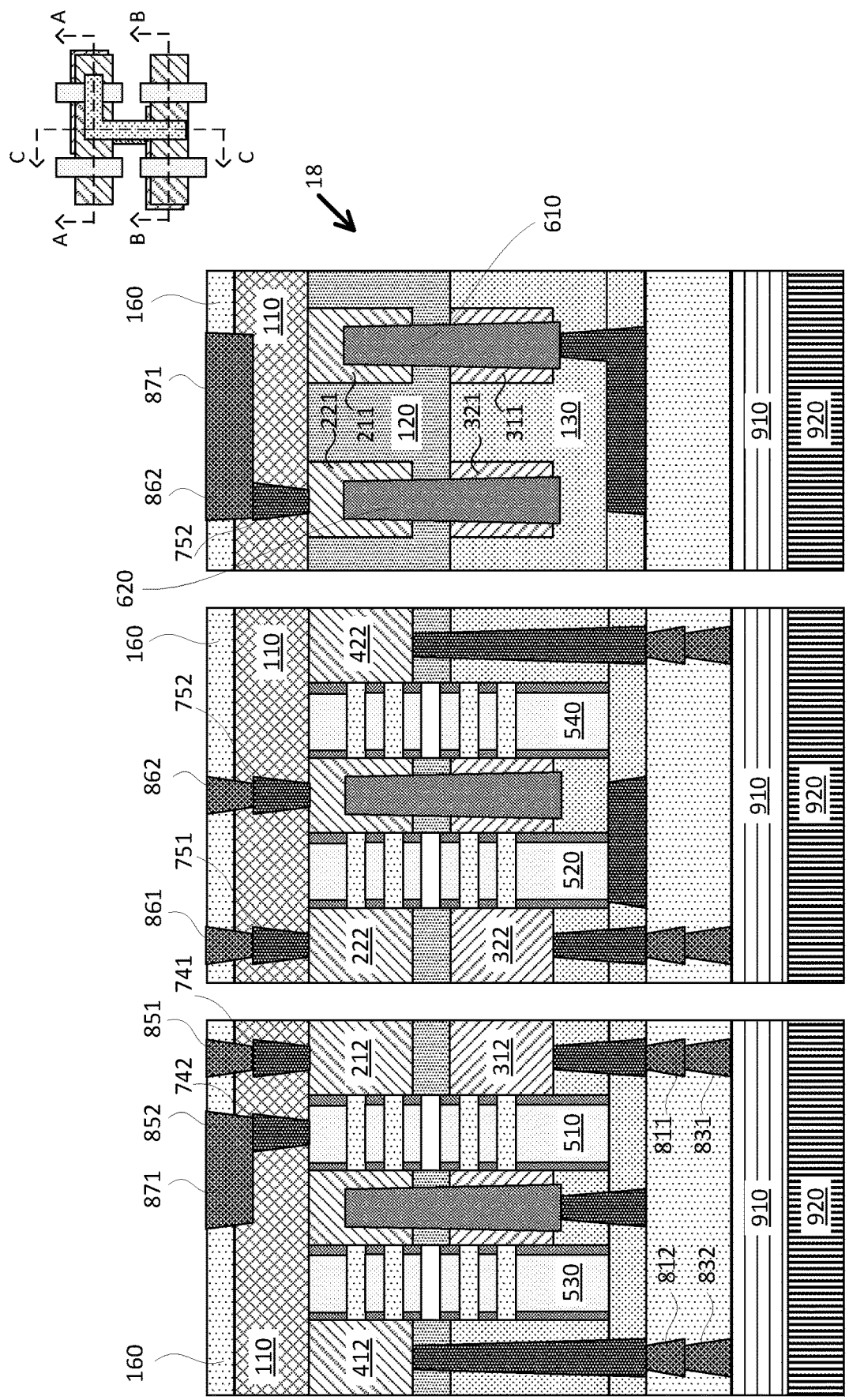

SRAM WITH BACKSIDE CROSS-COUPLE

BACKGROUND

The present application relates to manufacturing of semiconductor integrated circuits. More particularly, it relates to a static random-access-memory (SRAM) structure and method of manufacturing the same.

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain (S/D) regions of the devices. So-called CMOS (Complementary Metal Oxide Semiconductor) technology or product refers to integrated circuit products that are manufactured using both NMOS and PMOS transistor devices. Irrespective of the physical configuration of the transistor devices, each device comprises S/D regions and a gate electrode structure positioned above and between the S/D regions. Upon application of an appropriate control voltage to the gate electrode, a conductive channel region may be formed between the S/D regions. A conventional FET is a planar device wherein the entire channel region of the device is formed parallel and slightly below the planar upper surface of the semiconducting substrate. In contrast to a planar FET, there are so-called 3D devices, such as a FinFET device, which is a three-dimensional structure. These devices are typically arranged in a pattern that allows the devices to be interconnected to create functional units. For example, a static random-access memory (SRAM) cell typically includes two PMOS devices and four NMOS devices with different interconnects between the gates and S/D regions to create the memory cell. The various devices consume area in the circuit layout, resulting in a minimum cell area. Generally, reducing the cell area requires an advancement in the process used that allows smaller devices to be fabricated. It would be useful to reduce cell area without requiring a fundamental change in the fabrication processes.

SUMMARY

Embodiments of present invention provide a SRAM device. The SRAM device includes a frontside and a backside; a first pull-up (PU) transistor stacked over a first pull-down (PD) transistor; a second PU transistor stacked over a second PD transistor; and a backside cross-couple at the backside underneath the first and second PD transistors, the backside cross-couple connecting a first source/drain (S/D) region of the second PD transistor with a gate of the first PD transistor.

In one embodiment, the SRAM device further includes a first internal contact shared by a first S/D region of the first PU transistor and a first S/D region of the first PD transistor, and a frontside cross-couple at the frontside above the first and second PU transistors, the frontside cross-couple connecting the first internal contact with a gate of the second PU transistor.

In another embodiment, the SRAM device further includes a second internal contact shared by a first S/D region of the second PU transistor and the first S/D region of the second PD transistor. In one aspect, a first S/D region of a first pass-gate (PG) transistor shares the first internal contact with the first PU transistor and the first PD transistor, and a first S/D region of a second PG transistor shares the second internal contact with the second PU transistor and the second PD transistor. In another aspect, the backside cross-couple connects the second internal contact with the gate of the first PD transistor.

In yet another embodiment, the first PU transistor and the first PD transistor share a first common gate, and the second PU transistor and the second PD transistor share a second common gate. The SRAM device further includes a set of VDD power supply lines connected to a second S/D region of the first and second PU transistors at the frontside, and a set of VSS power supply lines connected to a second S/D region of the first and second PD transistors at the backside.

Embodiments of present invention provide a method of forming an SRAM device. The method includes forming a first pull-up (PU) transistor stacked over a first pull-down (PD) transistor and a second PU transistor stacked over a second PD transistor; and forming a backside cross-couple underneath the first and second PD transistors connecting a first source/drain (S/D) region of the second PD transistor with a gate of the first PD transistor.

BRIEF DESCRIPTION OF THE DRAWINGS

The present invention will be understood and appreciated more fully from the following detailed description of embodiments of present invention, taken in conjunction with accompanying drawings of which:

FIGS. 1A, 1B, and 1C are demonstrative illustrations of various cross-sectional views of a SRAM device during a process of manufacturing thereof according to embodiments of present invention;

FIGS. 8A, 8B, and 8C are demonstrative illustrations of various cross-sectional views of a SRAM device during a process of manufacturing thereof, following the steps illustrated in FIGS. 7A-7C, according to embodiments of present invention;

Figures 2A, 2B, 2C:
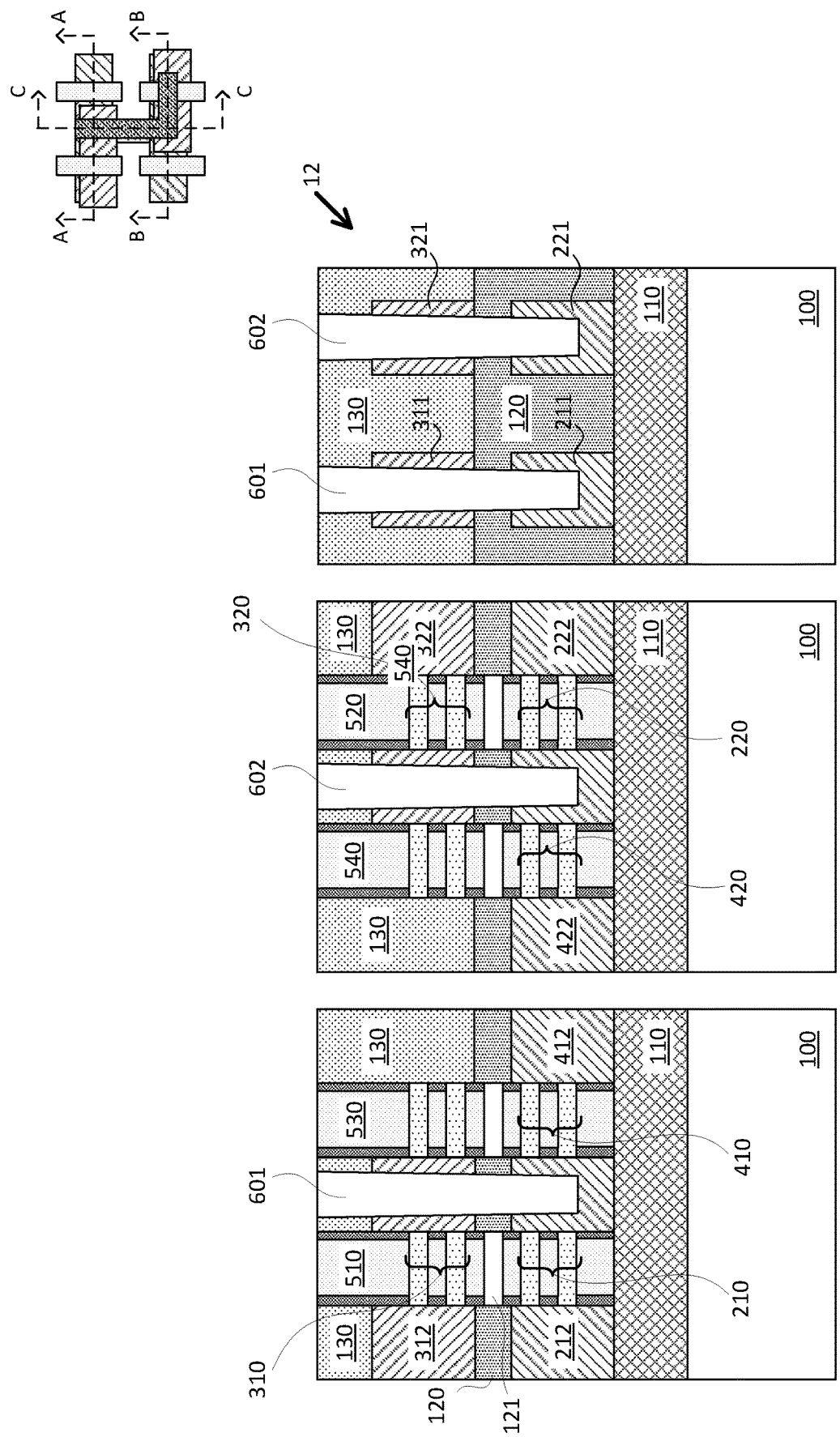
FIGS. 2A, 2B, and 2C are demonstrative illustrations of various cross-sectional views of a SRAM device during a process of manufacturing thereof, following the steps illustrated in FIGS. 1A-1C, according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to the different structural orientations of the semiconductor structures shown throughout the drawings, XYZ Cartesian coordinates may be shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Moreover, the same or similar reference numbers are used throughout the drawings to denote the same or similar features, elements, or structures, and thus, a detailed explanation of the same or similar features, elements, or structures may not be repeated for each of the drawings for economy of description.

FIGS. 1A, 1B, and 1C are demonstrative illustrations of various cross-sectional views of a SRAM device 11 during a process of manufacturing thereof according to embodiments of present invention. More specifically, with reference to a simplified layout view of the SRAM device shown at the upper-right corner, FIG. 1A and FIG. 1B illustrate cross-sectional views of SRAM device 11 along an arrowed A-A dash line and an arrowed B-B dash line across transistors respectively and FIG. 1C illustrates a cross-sectional view of SRAM device 11 along an arrowed C-C dash line across local interconnect. In the following drawings from FIGS. 2A-2C to FIGS. 5A-5C, cross-sectional reviews of the SRAM device at various manufacturing stages are provided in a manner like FIGS. 1A-1C, and thus similar description to these drawings will not be repeated.

According to one embodiment of present invention, a SRAM device may include a first and a second pull-up (PU) transistor, a first and a second pull-down (PD) transistor, and a first and a second pass-gate (PG) transistor. A first source/drain region of the first PU transistor and a first source/drain region of the first PD transistor may be connected and connected to a gate of the second PU transistor and a gate of the second PD transistor, which are connected as well. A first source/drain region of the second PU transistor and a first source/drain region of the second PD transistor may be connected and connected to a gate of the first PU transistor and a gate of the first PD transistor, which are connected as well.

Moreover, a first source/drain region of the first PG transistor may be connected to the first source/drain regions of the first PU transistor and the first PD transistor, and a first source/drain region of the second PG transistor may be connected to the first source/drain regions of the second PU transistor and the second PD transistor. A first set of power source, such as VDD (voltage at drain), may be connected to a second source/drain region of the first and second PU transistors and a second set of power source, such as VSS (voltage at source), may be connected to a second source/drain region of the first and second PD transistors. A set of bit lines (BL and BL-BAR) may be connected to a second source/drain regions of the first and second PG transistors, and a set of word lines may be connected to a gate of the first and second PG transistors.

Reference is made back to FIGS. 1A-1C. More specifically, FIG. 1A illustrates a cross-sectional view of a first PD transistor 210 with a first and a second source/drain region 211 and 212, a first PU transistor 310 with a first and a second source/drain region 311 and 312, and a first PG transistor 410 with a first and a second source/drain region 411 and 412. FIG. 1B illustrates a cross-sectional view of a second PD transistor 220 with a first and a second source/drain region 221 and 222, a second PU transistor 320 with a first and a second source/drain region 321 and 322, and a second PG transistor 420 with a first and a second source/drain region 421 and 422. FIG. 1C illustrates a cross-sectional view of local interconnect (to be formed later) and cross-sectional views, in a direction perpendicular to those illustrated in FIG. 1A and FIG. 1B, of the first source/drain regions 211 and 221 of the first and second PD transistors 210 and 220, the first source/drain regions 311 and 321 of the first and second PU transistors 310 and 320, and the first source/drain regions 411 and 421 of the first and second PG transistors 410 and 420.

The first and second PD transistors 210 and 220 and the first and second PG transistors 410 and 420 are formed directly on top of a first dielectric layer 110 which, in one embodiment, may be a buried oxide layer of a silicon-on-insulator (SOI) substrate. The first dielectric layer 110 may be formed or positioned on top of a semiconductor substrate 100. The semiconductor substrate 100 may be a bulk silicon substrate although embodiments of present invention are not limited in this aspect and other types of semiconductor substrate such as, for example, a germanium (Ge) substrate or a silicon-germanium (SiGe) substrate may be used as well. The source/drain regions of the first and second PD transistors 210 and 220 and the first and second PG transistors 410 and 420 are covered by a second dielectric layer 120 which may be, for example, an oxide ($SiO_2$) or silicon-nitride (SiN) layer.

The source/drain regions of the first PU transistor 310 is formed directly on top of the second dielectric layer 120 and vertically stacked over the first PD transistor 210. The source/drain regions of the second PU transistor 320 is formed directly on top of the second dielectric layer 120 and vertically stacked over the second PD transistor 220. The source/drain regions of the first and second PU transistors 310 and 320 may be covered by a third dielectric layer 130 which may be, for example, an oxide or silicon-nitride layer.

The first PU transistor 310 and the first PD transistor 210 share a first common gate 510 with a gate metal 511 and sidewall spacers 512. The second PU transistor 320 and the second PD transistor 220 share a second common gate 520 with a gate metal 521 and sidewall spacers 522. The first PG transistor 410 has a first gate 530 with a gate metal 531 and sidewall spacers 532 and the second PG transistor 420 has a second gate 540 with a gate metal 541 and sidewall spacers 542.

In FIGS. 1A and 1B, the first and second PD transistors 210 and 220, the first and second PU transistors 310 and 320, and the first and second PG transistors 410 and 420 are illustrated as being formed from nanosheets transistors. However, embodiments of present invention are not limited in this aspect and other types of transistors such as, for example, fin-type transistors and/or nanowire transistors may be used as well. A nanosheet 121 of dielectric material separates nanosheets for the first and second PU transistors 310 and 320 from nanosheets for the first and second PD transistors 210 and 220. Nanosheets for transistors such as the first and second PU transistors 310 and 320 and the first and second PD transistors 210 and 220 are normally made of semiconductor materials such as, for example, silicon (Si) or silicon-germanium (SiGe) and are different that of the nanosheet 121.

FIGS. 2A, 2B, and 2C are demonstrative illustrations of various cross-sectional views of a SRAM device 12 during a process of manufacturing thereof, following the steps illustrated in FIGS. 1A-1C, according to embodiments of present invention. More specifically, embodiments of present invention provide, for forming a first internal contact, forming a first opening 601 in the first source/drain regions of the first PU transistor 310 and the first PD transistor 210. The first opening 601 may be made through a lithographic patterning process followed by an etching process such as, for example, a reactive-ion-etching (RIE) etching process. The first opening 601 may be made through the third dielectric layer 130, the first source/drain region 311 of the first PU transistor 310, the second dielectric layer 120, and partially into the first source/drain region 211 of the first PD transistor 210. In one embodiment, the first opening 601 may be made sufficiently deep such that the first dielectric layer 110 may be exposed.

Similarly, embodiments of present invention provide, for forming a second internal contact, forming a second opening 602 in the second source/drain regions of the second PU transistor 320 and the second PD transistor 220. The second opening 602 may be made during a same lithographic patterning and etching process as that for the first opening 601. The second opening 602 may be made through the third dielectric layer 130, the first source/drain region 321 of the second PU transistor 320, the second dielectric layer 120, and partially into the first source/drain region 221 of the second PD transistor 220. In one embodiment, the second opening 602 may be made sufficiently deep such that the first dielectric layer 110 may be exposed.

Figures 3A, 3B, 3C:
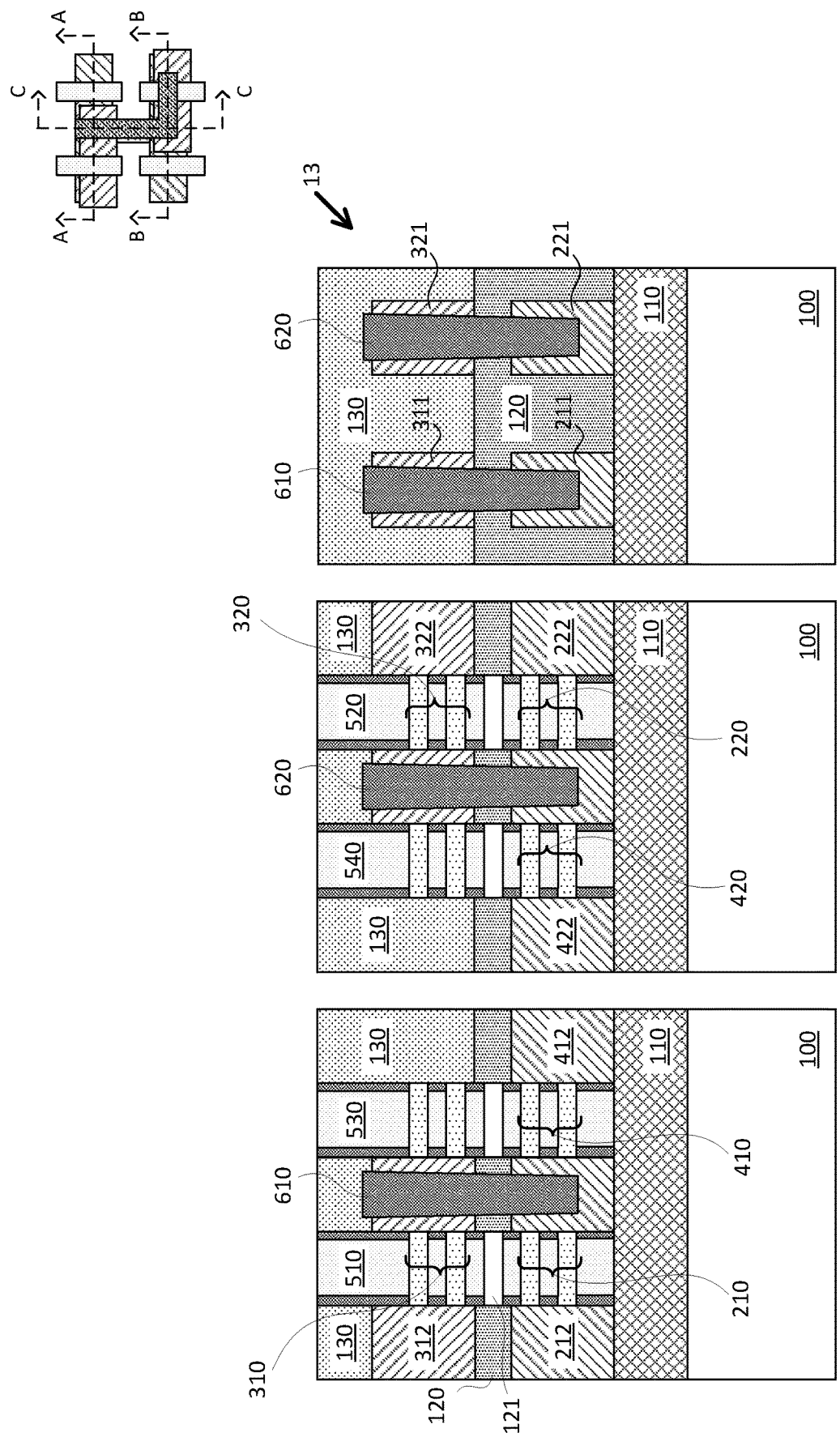
FIGS. 3A, 3B, and 3C are demonstrative illustrations of various cross-sectional views of a SRAM device during a process of manufacturing thereof, following the steps illustrated in FIGS. 2A-2C, according to embodiments of present invention.

FIGS. 3A, 3B, and 3C are demonstrative illustrations of various cross-sectional views of a SRAM device 13 during a process of manufacturing thereof, following the steps illustrated in FIGS. 2A-2C, according to embodiments of present invention. More specifically, embodiments of present invention provide metallizing the first opening 601 and the second opening 602 with conductive metals, such as tungsten (W), cobalt (Co), ruthenium (Ru), and copper (Cu) for example, to create a first internal contact 610 and a second internal contact 620. The metallization process may be a metal deposition process. Please note that a thin adhesive metal liner such as, for example, TiN may be deposited before bulk metal deposition. After the deposition of metals, embodiments of present invention provide removing excessive metals that are deposited on top of the third dielectric layer 130 through a chemical-mechanic-polishing (CMP) process such that, for example, the gate metal 510, 520, 530 and 540 may be exposed. Embodiments of present invention continue with recessing the first and second internal contacts 610 and 620 down to a level below a top surface of the third dielectric layer 130. For example, in one embodiment, metals of the first and second internal contacts 610 and 620 may be recessed to a level that is sufficiently close to that of the first source/drain region 311 of the first PU transistor 310 and the first source/drain region 321 of the second PU transistor 320. A new dielectric material may fill back the recesses created above the first and second internal contacts 610 and 620. The new dielectric material may be a same material as that of the third dielectric layer 130, as being demonstratively illustrated in FIGS. 3A-3C. However, embodiments of present invention are not limited in this aspect and dielectric materials different from that of the third dielectric layer 130 may be used as well.

As being illustrated in FIG. 3C, the first internal contact 610 and the second internal contact 620 may be formed to be at a relatively central portion of, and surrounded at sidewalls by, the first source/drain regions 311 and 321 of the first and second PU transistors 310 and 320, and the first source/drain regions 211 and 221 of the first and second PD transistor 210 and 220. However, embodiments of present invention are not limited in this aspect. In one embodiment, for example, the first internal contact 610 and the second internal contact 620 may be formed to deviate from the central portion of these source/drain regions to, for example, partially cover sidewalls of these source/drain regions as being demonstratively illustrated in FIG. 11A. In another embodiment, the first internal contact 610 and the second internal contact 620 may be formed to have, for example, an L-shape that connects the first source/drain region 311 of the first PU transistor 310 with the first source/drain region 211 of the first PD transistor 210, and/or connects the first source/drain region 321 of the second PU transistor 320 with the first source/drain region 221 of the second PD transistor 220 as being demonstratively illustrated in FIG. 11B. Other types of internal contacts are fully contemplated by embodiments of present invention as well.

Figure 4A:
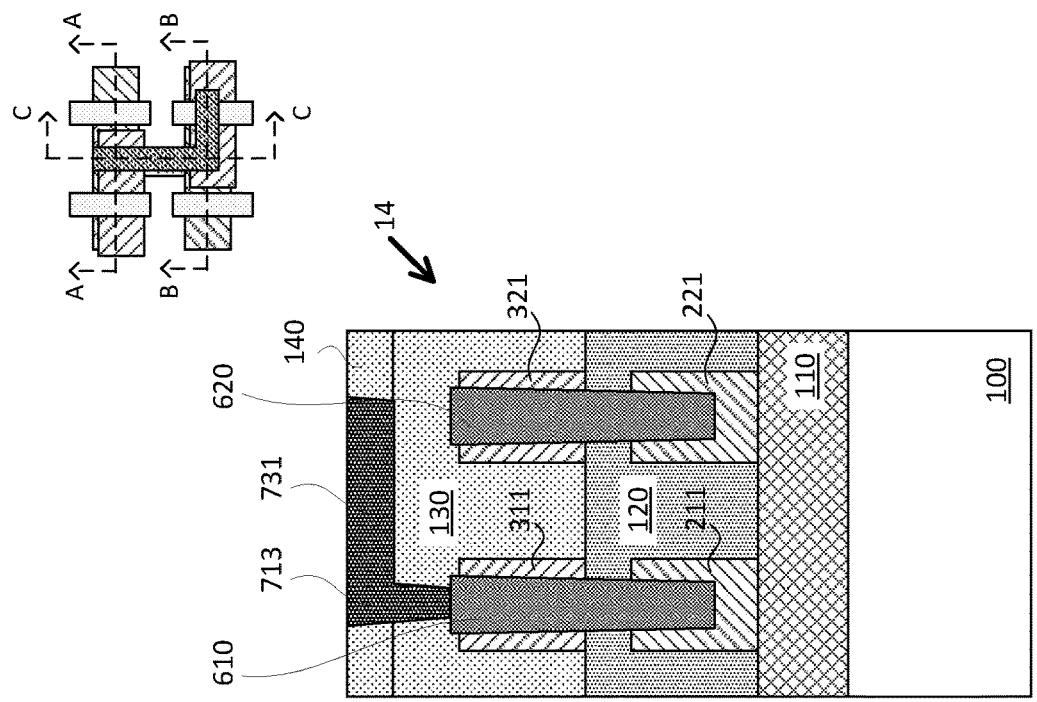
FIGS. 4A, 4B, and 4C are demonstrative illustrations of various cross-sectional views of a SRAM device during a process of manufacturing thereof, following the steps illustrated in FIGS. 3A-3C, according to embodiments of present invention.
Figure 4B:
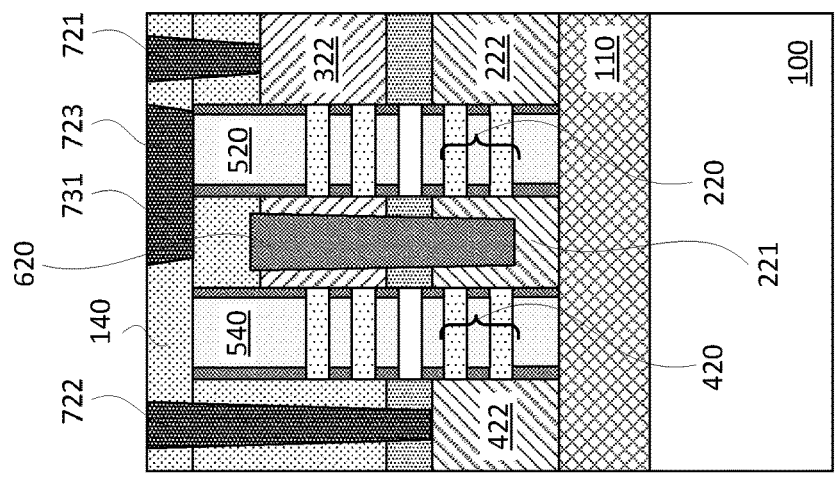
Figure 4C:
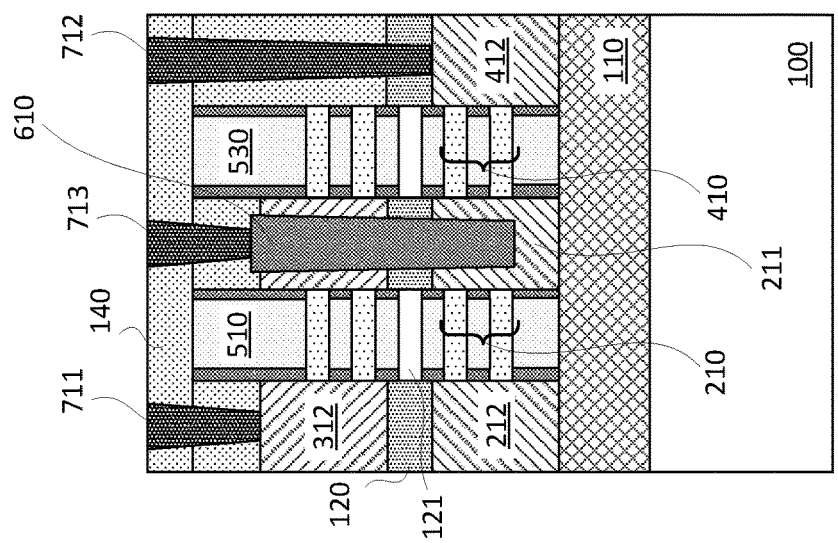

FIGS. 4A, 4B, and 4C are demonstrative illustrations of various cross-sectional views of a SRAM device 14 during a process of manufacturing thereof, following the steps illustrated in FIGS. 3A-3C, according to embodiments of present invention. For example, embodiments of present invention provide forming middle-of-line (MOL) contacts to contact the first and second PU transistors 310 and 320 and the first and second PG transistors 410 and 420. Hereinafter, for the ease of description without loss of generality, the SRAM device, for example SRAM device 14 as illustrated in FIGS. 4A-4C, is referred to have a frontside that is a side above the first and second PU transistors 310 and 320, and a backside that is a side beneath the first and second PD transistors 210 and 220. In other words, embodiments of present invention provide forming frontside MOL contacts to contact source/drain and/or gate of the first and second PU transistors 310 and 320 and the first and second PG transistors 410 and 420.

More specifically, embodiments of present invention provide forming a fourth dielectric layer 140 above the third dielectric layer 130. The fourth dielectric layer 140 may be formed above the first common gate 510 of the first PU transistor 310 and the second common gate 520 of the second PU transistor 320. The fourth dielectric layer 140 may also be above the first and second gates 530 and 540 of the first and second PG transistors 410 and 420. The fourth dielectric layer 140 may be a same dielectric material as that of the third dielectric layer 130 although embodiments of present invention are not limited in this aspect and different material may be used as well. Contact openings may subsequently be created through a lithographic patterning process to expose the second source/drain regions of the first and second PG transistors 410 and 420, the second source/drain regions of the first and second PU transistors 310 and 320, the first internal contact 610, and the second common gate 520 of the second PU transistor 320.

Embodiments of present invention further provide metallizing these contact openings to form frontside MOL contacts including, for example, source/drain contacts 712 and 722 to the first and second PG transistors 410 and 420, source/drain contacts 711 and 721 to the first and second PU transistors 310 and 320, a contact 713 to the first internal contact 610, and a contact 723 to the second common gate 520 of the second PU and PD transistors 320 and 220. Additionally, embodiments of present invention provide forming a cross-couple 731, a frontside MOL contact as well and also known as local interconnect, that couples the contact 713 with the contact 723. The frontside MOL contacts may be made of, for example, tungsten (W), cobalt (Co), ruthenium (Ru), and/or copper (Cu). The cross-couple 731 may connect the first internal contact 610 with the second common gate 520 of the second PU transistor 320. The cross-couple 731 is formed at the frontside of the SRAM device 14 and may be referred to herein as front cross-couple 731 as well.

Figure 5A:
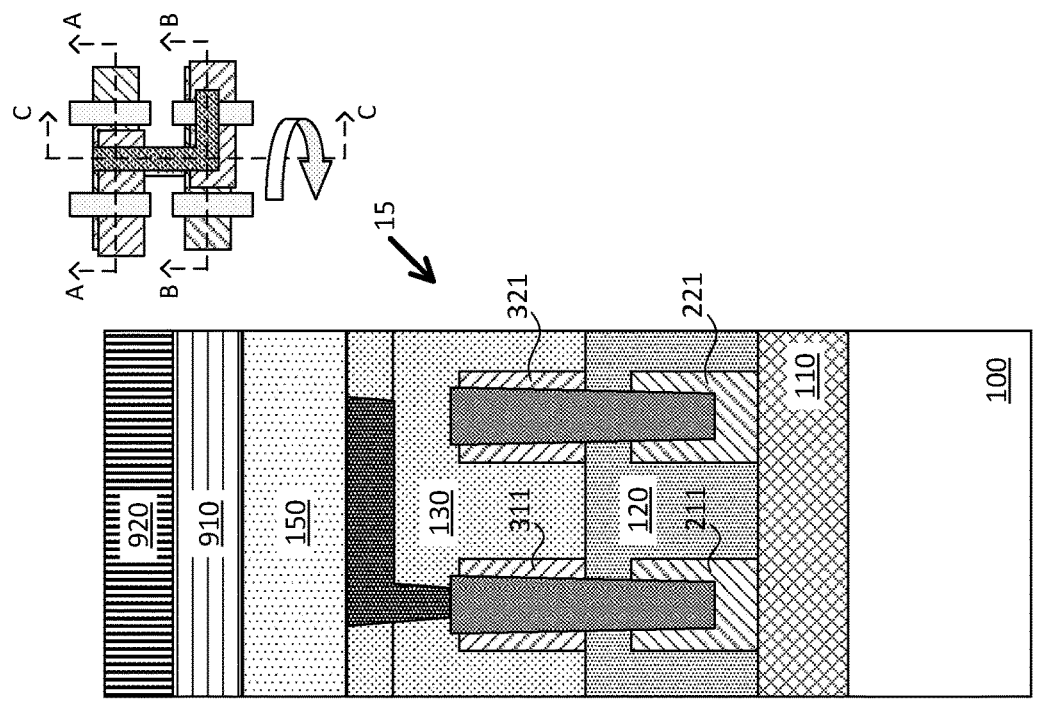
FIGS. 5A, 5B, and 5C are demonstrative illustrations of various cross-sectional views of a SRAM device during a process of manufacturing thereof, following the steps illustrated in FIGS. 4A-4C, according to embodiments of present invention.
Figure 5B:
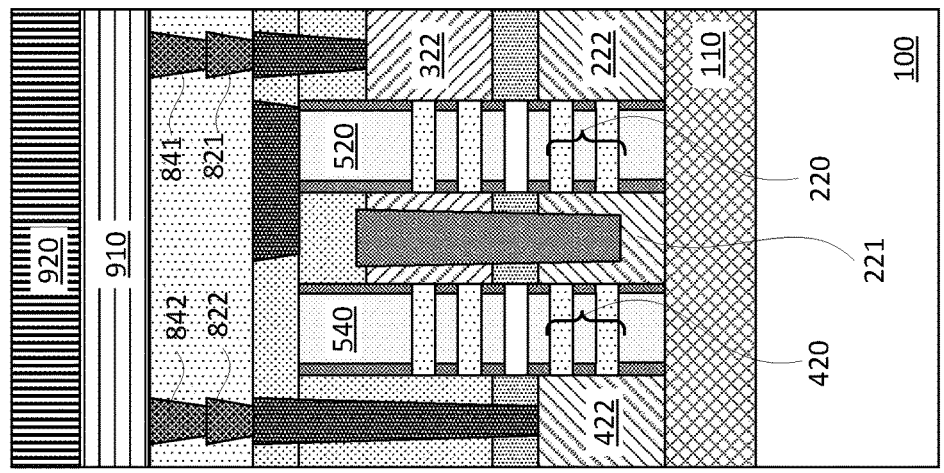
Figure 5C:
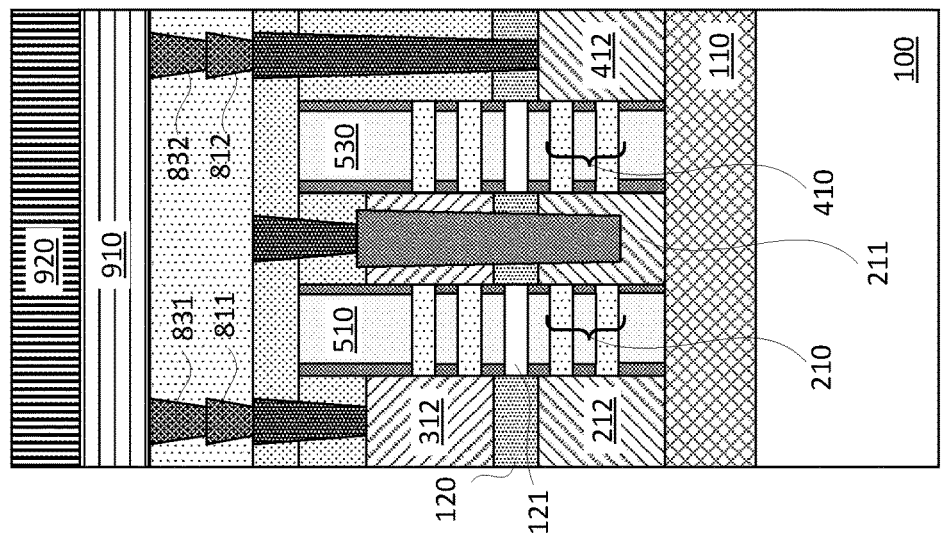

FIGS. 5A, 5B, and 5C are demonstrative illustrations of various cross-sectional views of a SRAM device 15 during a process of manufacturing thereof, following the steps illustrated in FIGS. 4A-4C, according to embodiments of present invention. For example, embodiments of present invention provide forming additional dielectric layer such as a fifth dielectric layer 150 covering the MOL contacts 711, 712, 713, 721, 722, 723, and 731 as being described above; forming via contacts 811 and 821 and VDD power supply lines 831 and 841 to the first and second PU transistors 310 and 320; and via contacts 812 and 822 and bit lines 832 and 842 to the first and second PG transistors 410 and 420. The MOL contacts, via contacts, and bit lines may be made of, for example, tungsten (W), cobalt (Co), ruthenium (Ru), and/or copper (Cu).

Subsequently, embodiments of present invention provide forming a plurality of back-end-of-line (BEOL) layers 910 above the fifth dielectric layer 150 that contains power supplies and bit lines to the SRAM device 15, and wafer bonding a carrier wafer 920 onto the BEOL layers 910. The carrier wafer 920 is bonded to the frontside of the SRAM device 15 such that the SRAM device 15 may be flipped upside-down, in a direction as illustrated by the curved arrow in the simplified layout view at the upper-right corner, for further processing at the backside as being described below in more details with reference to FIGS. 6A-6C and drawings thereafter.

Figure 6A:
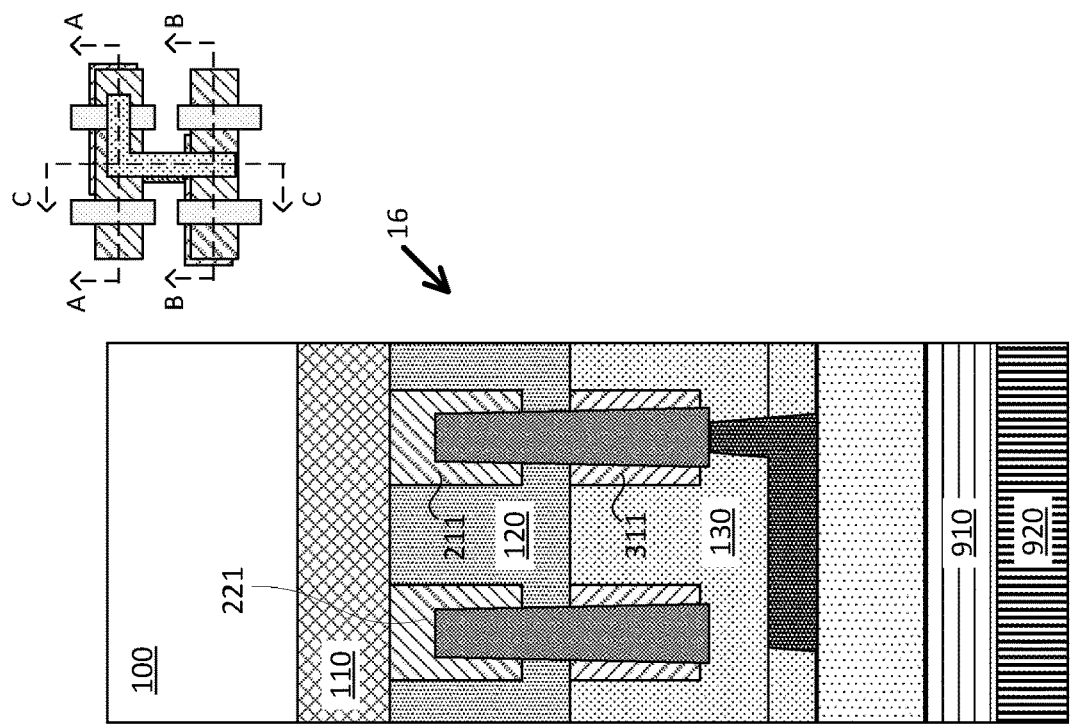
FIGS. 6A, 6B, and 6C are demonstrative illustrations of various cross-sectional views of a SRAM device during a process of manufacturing thereof, following the steps illustrated in FIGS. 5A-5C, according to embodiments of present invention.
Figure 6B:
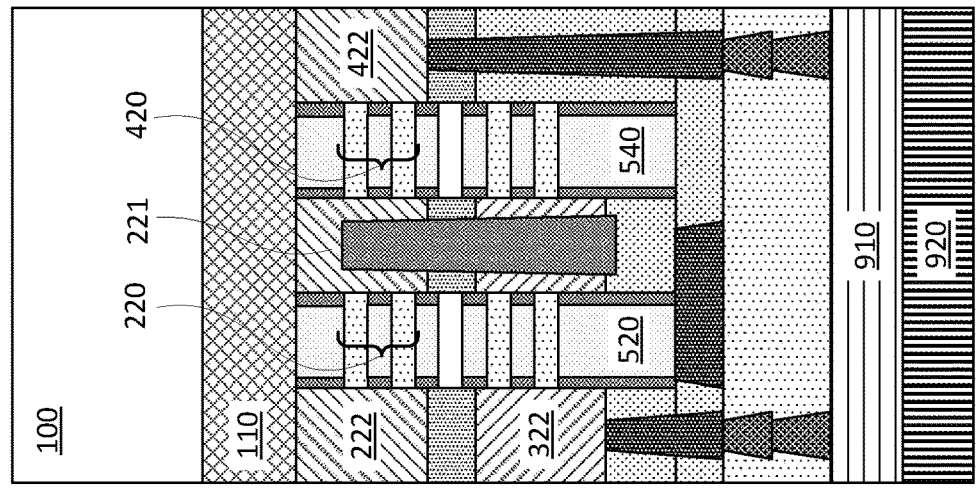
Figure 6C:
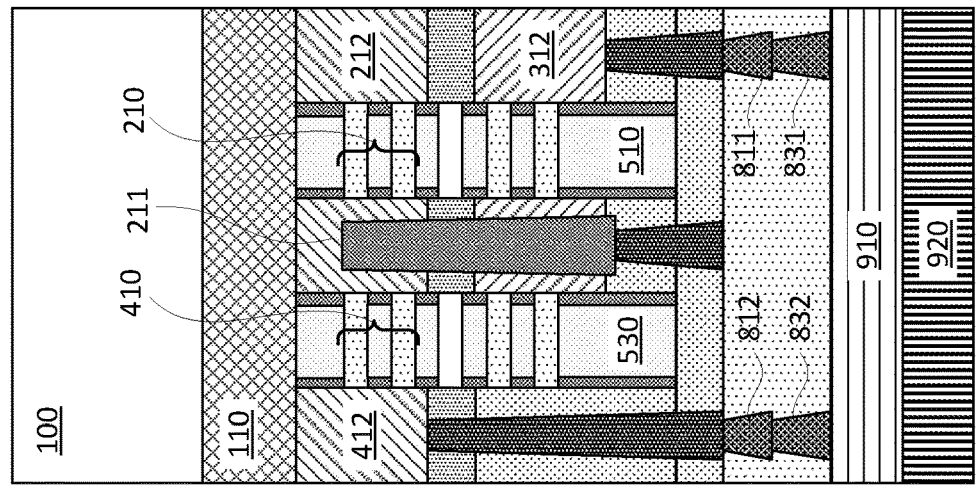

FIGS. 6A, 6B, and 6C are demonstrative illustrations of various cross-sectional views of a SRAM device 16 during a process of manufacturing thereof, following the steps illustrated in FIGS. 5A-5C, according to embodiments of present invention. More particularly, FIGS. 6A, 6B, and 6C are inverted views of FIGS. 5A, 5B, and 5C respectively when the SRAM device 15 is flipped upside-down along the direction indicated by the curved arrow in the simplified layout view at the upper-right corner of FIGS. 5A-5C. Here, attention is drawn to the simplified layout view at the upper-right corner of FIGS. 6A-6C, which represents an upside-down view of the SRAM device 15 illustrated in FIGS. 5A-5C. In particular, FIG. 6C is a cross-sectional view taken along dashed C-C line that is looking in a direction to the left, as opposed to looking in a direction to the right as in FIG. 5C.

Figures 7A, 7B, 7C:
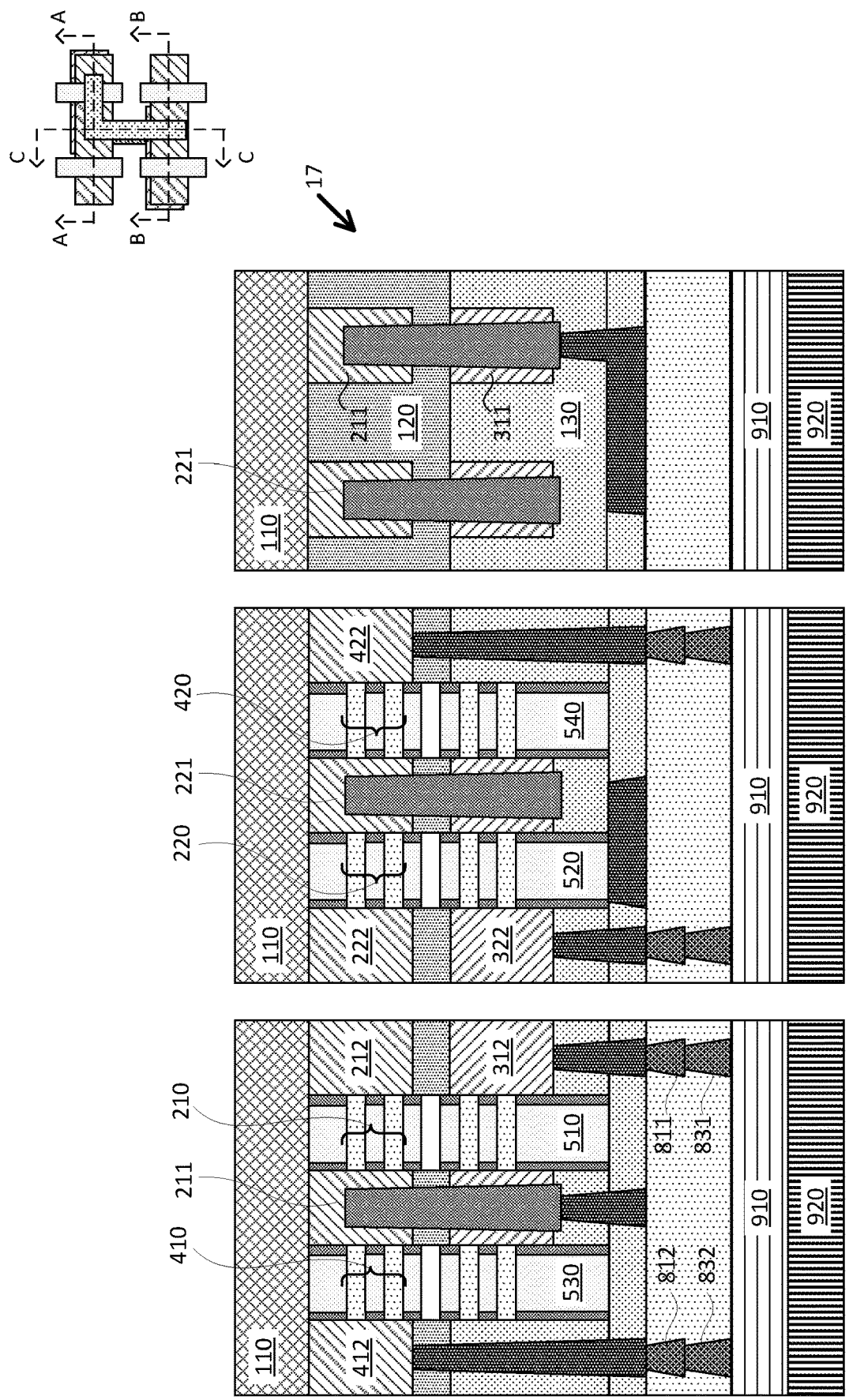
FIGS. 7A, 7B, and 7C are demonstrative illustrations of various cross-sectional views of a SRAM device during a process of manufacturing thereof, following the steps illustrated in FIGS. 6A-6C, according to embodiments of present invention.

FIGS. 7A, 7B, and 7C are demonstrative illustrations of various cross-sectional views of a SRAM device 17 during a process of manufacturing thereof, following the steps illustrated in FIGS. 6A-6C, according to embodiments of present invention. After flipping, processing may continue at the backside of the SRAM device 17. More specifically, embodiments of present invention provide removing the semiconductor substrate 100 from the backside of the SRAM device 17 such as, for example, through a wafer grinding, CMP, and/or etch processes. The removal of the semiconductor substrate 100 may stop when the first dielectric layer 110 is exposed. However, embodiments of present invention are not limited in this aspect. A portion of the first dielectric layer 110 may be removed as well in some embodiment without deviation from the spirit of present invention. In the event that too much of the first dielectric layer 110 is removed, additional dielectric material may be deposited onto the first dielectric layer 110 to compensate for the portions being removed.

FIGS. 8A, 8B, and 8C are demonstrative illustrations of various cross-sectional views of a SRAM device 18 during a process of manufacturing thereof, following the steps illustrated in FIGS. 7A-7C, according to embodiments of present invention. More specifically, as being described above, in one embodiment a sixth dielectric layer 160 may be deposited to pad up the thickness of the first dielectric layer 110 within which backside contacts and power supply lines for the SRAM device 18 may be formed.

For example, embodiments of present invention provide forming backside contacts including, for example, source/drain contacts 741 and 751 to contact the second source/drain regions 212 and 222 of the first and second PD transistors 210 and 220 respectively; a gate contact 742 contacting the first common gate 510 of the first PD transistor 210; and a source/drain contact 752 contacting the first source/drain region 221 of the second PD transistor 220. The source/drain contacts and gate contact may be made of, for example, tungsten (W), cobalt (Co), ruthenium (Ru), and/or copper (Cu). In one embodiment, as being described above with reference to FIG. 2B in forming the second opening 602 and FIG. 3B in forming the second internal contact 620, the second internal contact 620 may be formed deep into, or at least to be in contact with, the first dielectric layer 110. Therefore, in this embodiment, the source/drain contact 752 may contact directly with the second internal contact 620. In yet another embodiment, the source/drain contact 752 may be formed deep into the first source/drain regions 221 of the second PD transistor 220 to be in direct contact with the second internal contact 620, as being described below in more details with reference to FIG. 11C.

Embodiments of present invention may further provide forming VSS power supply lines 851 and 861 in contact with the source/drain contacts 741 and 751 of the second source/drain regions 212 and 222 of the first and second PD transistors 210 and 220; forming a contact 852 contacting the gate contact 742, a contact 862 contacting the source/drain contact 752, and a second cross-couple 871 connecting the contact 852 and the contact 862. In other words, cross-couple 871 cross connects the gate 510 of the first PD transistor 210 with the first source/drain region 221 of the second PD transistor 220. Since the cross-couple 871 is formed at the backside of the SRAM device 18, the cross-couple 871 may be referred to as a backside cross-couple. In one embodiment, the cross-couple 871, the contact 852, and the contact 862 may be collectively referred to as a cross-couple or backside cross-couple.

Figure 9C:
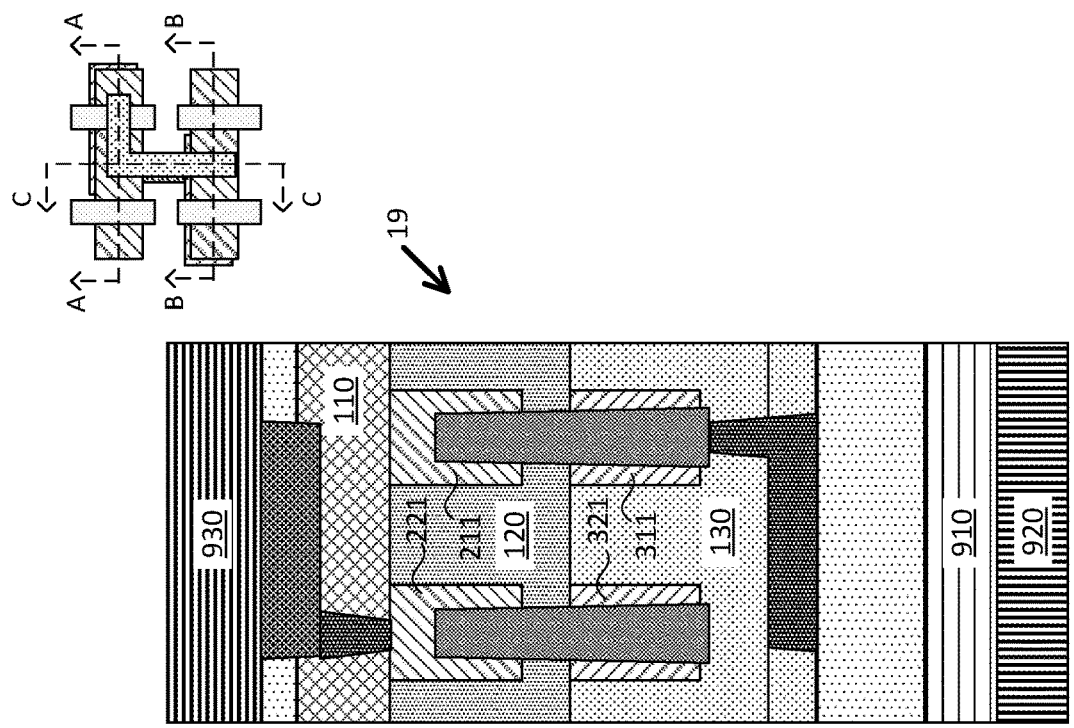
FIGS. 9A, 9B, and 9C are demonstrative illustrations of various cross-sectional views of a SRAM device during a process of manufacturing thereof, following the steps illustrated in FIGS. 8A-8C, according to embodiments of present invention.
Figure 9B:
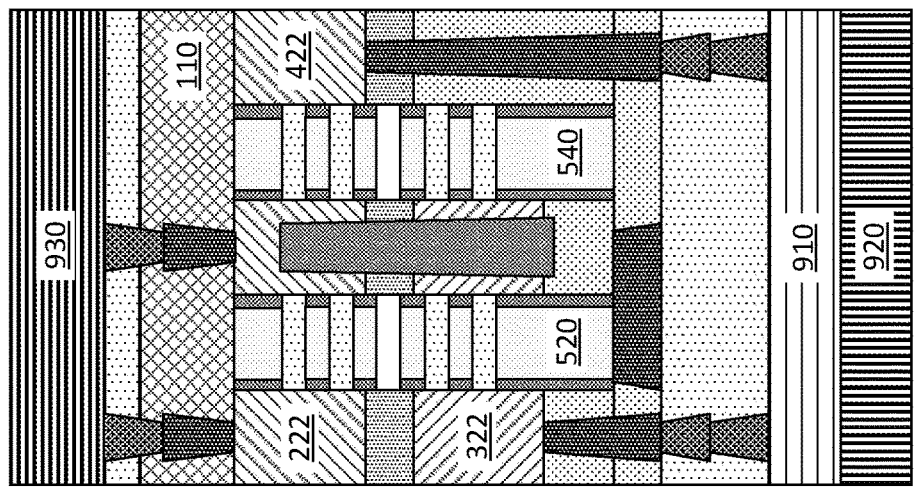
Figure 9A:
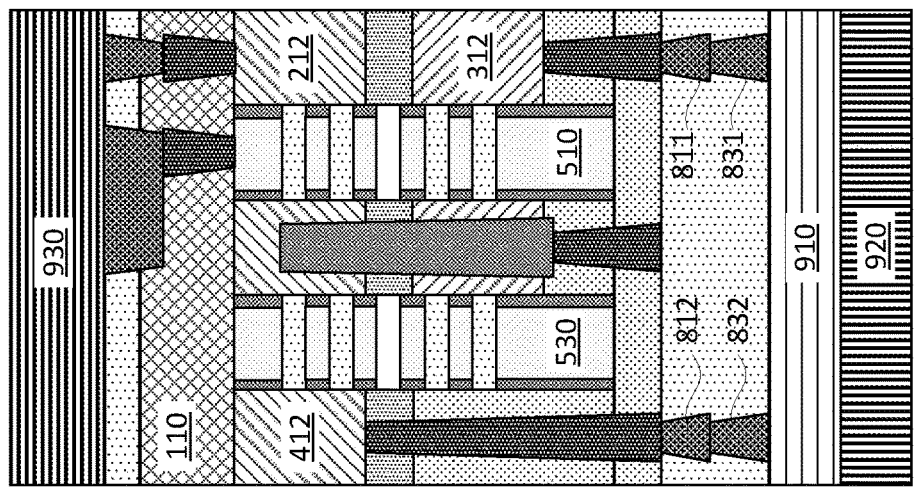

FIGS. 9A, 9B, and 9C are demonstrative illustrations of various cross-sectional views of a SRAM device 19 during a process of manufacturing thereof, following the steps illustrated in FIGS. 8A-8C, according to embodiments of present invention. More particularly, embodiments of present invention provide further forming a backside power distribution network (BSPDN) 930 on top of the sixth dielectric layer 160 and/or the first dielectric layer 110. In other words, the BSPDN 930 may be formed on top of the backside power supply lines for the SRAM device 18 and the backside cross-couple 871.

Figure 10:
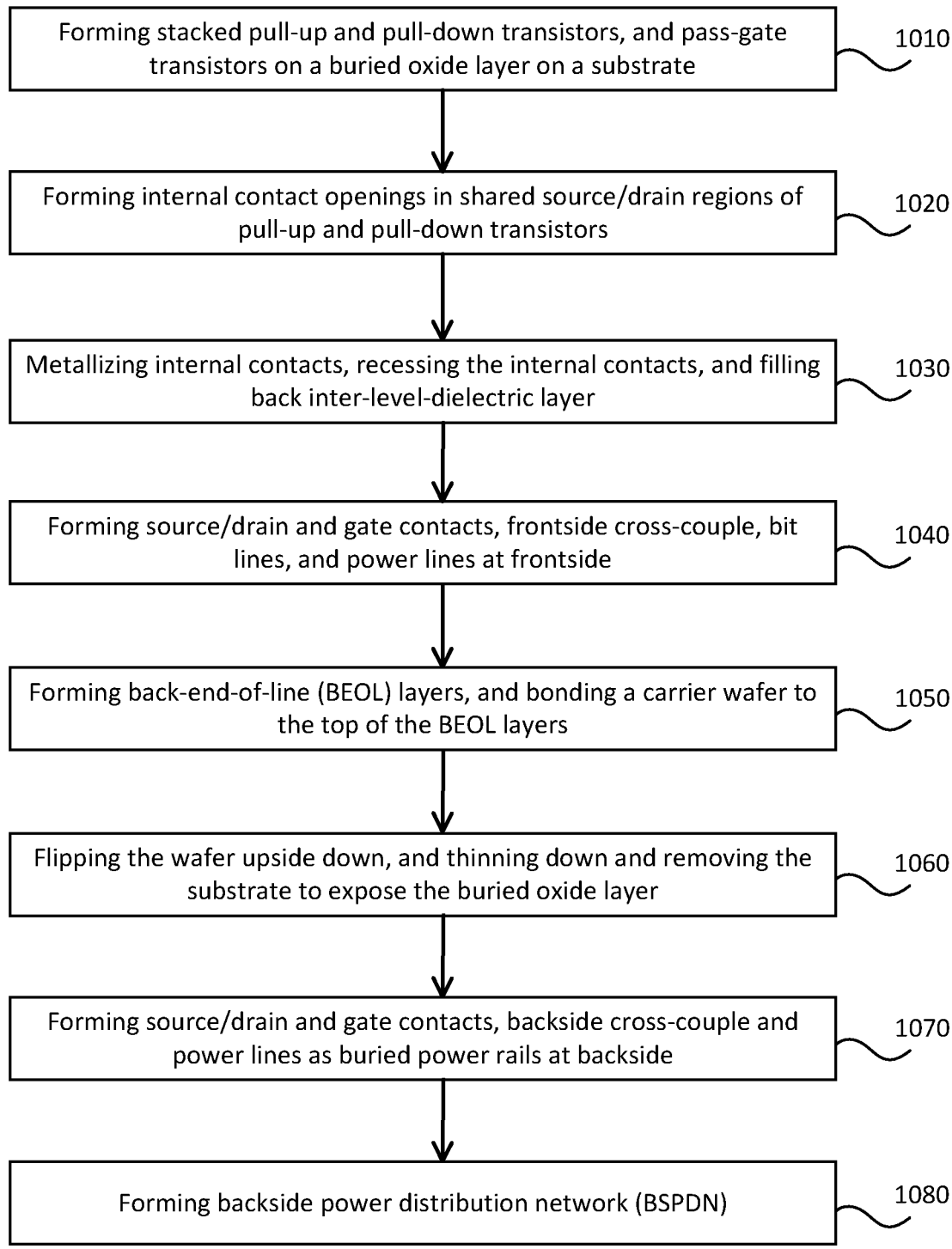
FIG. 10 is a demonstrative illustration of a flow-chart of a method of manufacturing a SRAM device according to embodiments of present invention.

FIG. 10 is a demonstrative illustration of a flow-chart of a method of manufacturing a SRAM device according to embodiments of present invention. More particularly, embodiments of present invention provide (1010) forming stacked pull-up (PU) and pull-down (PD) transistors and pass-gate (PG) transistors on a dielectric layer such as a buried oxide layer on a semiconductor substrate. For example, the PU, PD, and PG transistors may be formed on top of a silicon-on-insulator (SOI) substrate which includes a buried oxide layer. Embodiments of present invention may further provide (1020) forming internal contact openings in shared source/drain regions of the PU and PD transistors such as, for example, a first internal contact opening in a first source/drain region shared by a first PU and a first PD transistor, and a second internal contact opening in a second source/drain region shared by a second PU and a second PD transistor. Embodiments of present invention then provide (1030) metallizing the openings to create first and second internal contacts; recessing the internal contacts below a desired level such as, for example, below a gate level of the first and second PU transistors; and back filling the recesses with a dielectric material. Embodiments of present invention provide (1040) forming frontside MOL contacts including source/drain contacts to the second source/drain regions of first and second PU transistors; a gate contact to the gate of second PU transistor; a contact to the first internal contact; and a cross-couple to connect the gate contact to the gate of second PU transistor and the contact to the first internal contact, thereby connecting the first internal contact with the gate of second PU transistor. Embodiments of present invention may further include forming bit lines and power supply lines such as VDD power supply lines over the MOL contacts. Thereafter, embodiments of present invention provide (1050) forming a plurality of BEOL layers on top of the device, and subsequently wafer bonding a wafer to the top of the BEOL layers, thereby providing a handler flipping the SRAM device for further processing at a backside thereof. For example, embodiments of present invention provide (1060) flipping the wafer upside down and thinning down and eventually removing the semiconductor substrate to expose the underneath dielectric layer which may be a buried oxide layer; (1070) forming source/drain contacts to the second source/drain regions of the first and second PD transistors; a gate contact to the gate of the first PD transistor; and a source/drain contact to the first source/drain region of the second PD transistor. Embodiments of present invention further provide forming a backside cross-couple connecting the gate of the first PD transistor with the first source/drain region of the second PD transistor and forming power supply lines such as VSS power supply lines for the SRAM device. Subsequently, embodiments of present invention provide (1080) forming backside power distribution network (BSPDN).

Figure 11C:
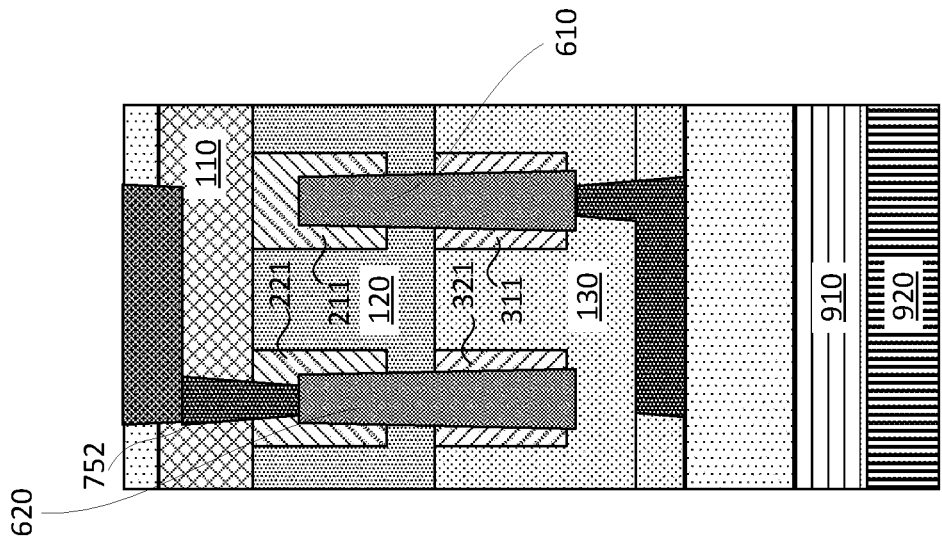
FIGS. 11A, 11B, and 11C are demonstrative illustrations of cross-sectional views of a SRAM device during a process of manufacturing thereof according to various embodiments of present invention.
Figure 11B:
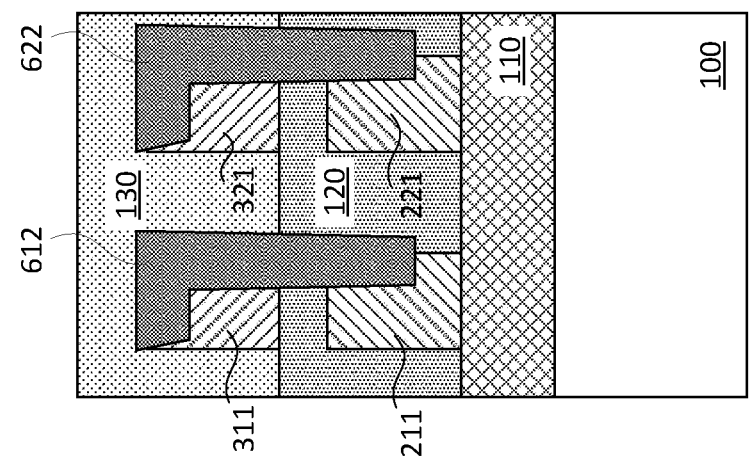
Figure 11A:
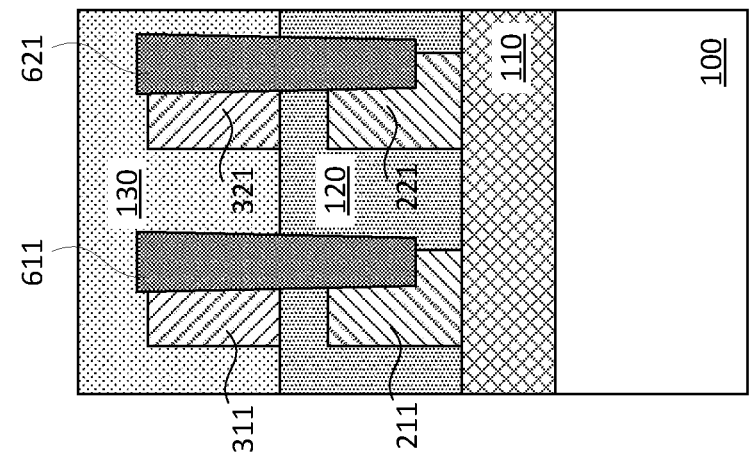

FIGS. 11A, 11B, and 11C are demonstrative illustrations of cross-sectional views of a SRAM device during a process of manufacturing thereof according to various embodiments of present invention. More specifically, FIG. 11A illustrates an embodiment, as compared to the embodiment illustrated in FIG. 3C, of forming the first and second internal contacts 611 and 621. During the formation, the first and second internal contacts 611 and 621 may be formed to deviate away from a central portion of the first source/drain region 311 of the first PU transistor 310 and the first source/drain region 321 of the second PU transistor 320. For example, the first and second internal contacts 611 and 621 may be formed partially to the sidewalls of the first source/drain regions 311 and 211 of the first PU and first PD transistors 310 and 210, and to the sidewalls of the first source/drain regions 321 and 221 of the second PU and second PD transistors 320 and 220.

FIG. 11B illustrates yet another embodiment wherein an L-shape first internal contact 612 and an L-shape second internal contact 622 may be formed to contact the first source/drain regions 311 and 211 of the first PU and first PD transistors 310 and 210, and to contact the first source/drain regions 321 and 221 of the second PU and second PD transistors 320 and 220.

FIG. 11C illustrates another embodiment wherein, as being compared with the embodiment illustrated in FIG. 8C, the source/drain contact 752 may be made beyond the first dielectric layer 110 deep into the first source/drain region 221 of the second PD transistor 220 such that the source/drain contact 752 is in direct contact with the second internal contact 620.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and there hereby all contemplated and considered within the scope of present invention. It is, therefore, to be understood that the appended claims are intended to cover all such modifications and changes as fall within the spirit of the invention.

What is claimed is:

1. An SRAM device comprising:
    a frontside and a backside;
    a first pull-up (PU) transistor stacked over a first pull-down (PD) transistor;
    a second PU transistor stacked over a second PD transistor; and
    a backside cross-couple at the backside underneath the first and second PD transistors, the backside cross-couple connecting a first source/drain (S/D) region of the second PD transistor with a gate of the first PD transistor.

2. The SRAM device of claim 1, further comprising a first internal contact shared by a first S/D region of the first PU transistor and a first S/D region of the first PD transistor, and a frontside cross-couple at the frontside above the first and second PU transistors, the frontside cross-couple connecting the first internal contact with a gate of the second PU transistor.

3. The SRAM device of claim 2, further comprising a second internal contact shared by a first S/D region of the second PU transistor and the first S/D region of the second PD transistor.

4. The SRAM device of claim 3, wherein a first S/D region of a first pass-gate (PG) transistor shares the first internal contact with the first PU transistor and the first PD transistor, and a first S/D region of a second PG transistor shares the second internal contact with the second PU transistor and the second PD transistor.

5. The SRAM device of claim 3, wherein the backside cross-couple connects the second internal contact with the gate of the first PD transistor.

6. The SRAM device of claim 1, wherein the first PU transistor and the first PD transistor share a first common gate, and the second PU transistor and the second PD transistor share a second common gate.

7. The SRAM device of claim 1, further comprising a set of VDD power supply lines connected to a second S/D region of the first and second PU transistors at the frontside, and a set of VSS power supply lines connected to a second S/D region of the first and second PD transistors at the backside.

8. A method of forming an SRAM device comprising:
    forming a first pull-up (PU) transistor stacked over a first pull-down (PD) transistor and a second PU transistor stacked over a second PD transistor; and
    forming a backside cross-couple underneath the first and second PD transistors connecting a first source/drain (S/D) region of the second PD transistor with a gate of the first PD transistor.

9. The method of claim 8, further comprising forming a first internal contact shared by a first S/D region of the first PU transistor and a first S/D region of the first PD transistor and forming a second internal contact shared by a first S/D region of the second PU transistor and the first S/D region of the second PD transistor.

10. The method of claim 9, further comprising forming a frontside cross-couple above the first and second PU transistors connecting the first S/D region of the first PU transistor with a gate of the second PU transistor.

11. The method of claim 10, further comprising forming contacts to second source/drain regions of the first PU transistor, the second PU transistor, a first pass-gate (PG) transistor, and a second PG transistor; and forming a set of bit lines and a set of VDD power supply lines above the first and second PU transistors.

12. The method of claim 11, further comprising forming a set of back-end-of-line (BEOL) layers over the set of bit lines and the set of VDD power supply lines and bonding a carrier wafer to the BEOL layers.

13. The method of claim 12, wherein, before forming the backside cross-couple, the first and second PD transistors are formed on a buried oxide layer over a semiconductor substrate, further comprising flipping the carrier wafer, removing the semiconductor substrate to expose the buried oxide layer, and forming contacts to the first and second PD transistors.

14. The method of claim 13, further comprising forming a set of VSS power supply lines connecting to a second S/D region of the first and second PD transistors.

15. The method of claim 14, further comprising forming backside power distribution network (BSPDN) above the set of VSS power supply lines.

16. An SRAM memory comprising:
a frontside and a backside;
a first pull-up (PU) transistor stacked over a first pull-down (PD) transistor;
a second PU transistor stacked over a second PD transistor;
a frontside cross-couple at the frontside above the first and second PU transistors, the frontside cross-couple connecting a first source/drain (S/D) region of the first PU transistor with a gate of the second PU transistor; and
a backside cross-couple at the backside underneath the first and second PD transistors, the backside cross-couple connecting a first S/D region of the second PD transistor with a gate of the first PD transistor.

17. The SRAM memory of claim 16, further comprising a first internal contact shared by the first S/D region of the first PU transistor and a first S/D region of the first PD transistor, a second internal contact shared by a first S/D region of the second PU transistor and the first S/D region of the second PD transistor, wherein the frontside cross-couple connects to the first S/D region of the first PU transistor via the first internal contact.

18. The SRAM memory of claim 17, wherein the backside cross-couple connects to the second internal contact shared by the first S/D region of the second PD transistor.

19. The SRAM memory of claim 17, wherein a first S/D region of a first pass-gate (PG) transistor shares the first internal contact with the first PU transistor and the first PD transistor, and a first S/D region of a second PG transistor shares the second internal contact with the second PU transistor and the second PD transistor.

20. The SRAM memory of claim 16, further comprising a set of VDD power supply lines connecting to a second S/D region of the first and second PU transistors at the frontside, and a set of VSS power supply lines connecting to a second S/D region of the first and second PD transistors at the backside.

* * * * *